(12) United States Patent
Akiyoshi

(10) Patent No.: US 6,825,701 B2
(45) Date of Patent: Nov. 30, 2004

(54) POWER-ON RESET CIRCUIT/METHOD FOR INITIALIZING AN INTEGRATED CIRCUIT

(75) Inventor: Hideo Akiyoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/769,534

(22) Filed: Jan. 26, 2001

(65) Prior Publication Data

US 2001/0054921 A1 Dec. 27, 2001

(30) Foreign Application Priority Data

Jun. 27, 2000 (JP) ........................................ 2000-192228

(51) Int. Cl.[7] ........................... H03K 5/13; H03K 17/22
(52) U.S. Cl. ...................................... 327/143; 327/198
(58) Field of Search ................................ 327/142, 143, 327/198, 227

(56) References Cited

U.S. PATENT DOCUMENTS

| | | | | |
|---|---|---|---|---|
| 4,446,381 A | * | 5/1984 | Dalrymple | 327/143 |
| 5,323,066 A | * | 6/1994 | Feddeler et al. | 327/142 |
| 5,394,104 A | * | 2/1995 | Lee | 327/143 |
| 5,831,460 A | * | 11/1998 | Zhou | 327/143 |
| 6,078,201 A | * | 6/2000 | Crotty | 327/143 |
| 6,097,225 A | * | 8/2000 | Smith | 327/143 |
| 6,252,442 B1 | * | 6/2001 | Malherbe | 327/143 |
| 6,271,714 B1 | * | 8/2001 | Shin | 327/143 |
| 6,351,179 B1 | * | 2/2002 | Ikehashi et al. | 327/541 |
| 6,362,669 B1 | * | 3/2002 | Zhou et al. | 327/143 |
| 6,492,848 B1 | * | 12/2002 | Lee | 327/143 |

* cited by examiner

Primary Examiner—Timothy P. Callahan
Assistant Examiner—Terry L. Englund
(74) Attorney, Agent, or Firm—Arent Fox PLLC

(57) ABSTRACT

The semiconductor integrated circuit is provided with a plurality of sub reset signal generators and a main reset signal generator. The sub reset signal generators respectively generate sub power-on reset signals whose timings differ from each other. The main reset signal generator generates a main power-on reset signal according to at least one from any of the sub power-on reset signals. Therefore, even where the characteristics of elements constituting the semiconductor integrated circuit change due to changes in the manufacturing conditions of the semiconductor integrated circuit, one of the sub power-on reset signals is generated at a normal timing. As a result, the main reset signal generator is able to generate a main power-on reset signal by using a normal sub power-on reset signal. That is, it is possible to constitute a power-on resetting circuit having a wide operation margin, wherein the internal circuits can be initialized without fault.

8 Claims, 5 Drawing Sheets

POWER-ON RESET CIRCUIT/METHOD FOR INITIALIZING AN INTEGRATED CIRCUIT

BACKGROUND OF THE INVENTION

1. Field of the Invention

The present invention relates to a semiconductor integrated circuit having a power-on resetting circuit and a method for initializing the semiconductor integrated circuit.

2. Description of the Related Art

Generally, a semiconductor integrated circuit has a power-on resetting circuit that generates a power-on reset signal. Malfunction of the semiconductor integrated circuit can be prevented by generating a power-on reset signal when the power supply is switched on and initializing the internal circuits. This type of a power-on resetting circuit detects, by utilizing the threshold voltage of a transistor, when the power supply voltage rises to a predetermined value, and varies (inactivates) the logic level of the power-on reset signal. The internal circuits are initialized in an activating period until the level of the power-on reset signal varies, and commences normal operation after the power-on reset signal is inactivated.

Recently, the transistor structure of the semiconductor integrated circuit has been further refined. Since the channel length of a transistor is shortened, the fluctuation width of the threshold voltage of the transistor is increased due to a short channel effect. The threshold voltage of the transistor varies, depending on the manufacturing conditions of the semiconductor integrated circuit, the chip position on the wafer, and the wafer position of production lots. If the fluctuation width of the threshold voltage is increased, deviation of inactivation timings of the power-on reset signal is also increased.

Also, the operation voltage of the semiconductor integrated circuit is lowered, and the power supply voltage supplied from the exterior is also lowered. Since the threshold voltage of the transistor scarcely depends on the power supply voltage, the ratio of the threshold voltage of the transistor with respect to the power supply voltage is increased. Resultantly, as described above, the deviation in inactivation timings of the power-on reset signal is increased.

As a result, for example, where the inactivation timing of the power-on reset signal shifts to the advanced side, the resetting period to initialize the internal circuits is shortened, and there is a fear that the internal circuits are not normally initialized. Where the inactivation timing of the power-on reset signal shifts to the delayed side, there is a fear that the logic level of the power-on resetting signal will not change. At this time, the power-on reset signal usually enters the activating state. Therefore, the internal circuits are always initialized, and they do not normally operate.

SUMMARY OF THE INVENTION

It is an object of the invention to initialize internal circuits by reliably generating a power-on reset signal without depending on the characteristics of a transistor.

According to one of the aspects of a semiconductor integrated circuit of the present invention, the semiconductor integrated circuit is provided with a plurality of sub reset signal generators and a main reset signal generator. The sub reset signal generators respectively generate sub power-on reset signals whose timings differ from each other. The main reset signal generator generates a main power-on reset signal according to at least one from any of the sub power-on reset signals. Therefore, even where the characteristics of elements that constitute the semiconductor integrated circuit change due to changes in the manufacturing conditions of the semiconductor integrated circuit, one of the sub power-on reset signals is generated at a normal timing. As a result, the main reset signal generator is able to generate a main power-on reset signal by using a normal sub power-on reset signal. That is, it is possible to constitute a power-on resetting circuit having a wide operation margin, wherein the internal circuits can be initialized without fault.

According to another aspect of a semiconductor integrated circuit of the present invention, the main power-on reset signal generator has pulse generators corresponding to the respective sub power-on reset signals. The pulse generators respectively generate pulses synchronizing with transition edges of the sub power-on reset signals. The main power-on reset signal can be easily generated by synthesizing these pulses.

According to still another aspect of a semiconductor integrated circuit of the present invention, the semiconductor integrated circuit is provided with a sub power-on reset signal generator, which generates sub power-on reset signals, and a main reset signal generator. The main reset signal generator generates a main power-on reset signal according to at least one of sub power-on reset signal and an external power-on reset signal supplied through a reset terminal. That is, it can generate a main power-on reset signal by using not only a sub power-on reset signal but also an external power-on reset signal supplied through the reset terminal, whereby the internal circuits can be initialized without fault.

According to yet another aspect of a semiconductor integrated circuit of the present invention, the semiconductor integrated circuit is provided with a plurality of sub reset signal generators and a main reset signal generator. The sub reset signal generators respectively generate sub power-on reset signals whose timings differ from each other. The main reset signal generator generates a main power-on reset signal according to at least one from any of a plurality of sub power-on reset signals and the external power-on reset signal supplied through the reset terminal. That is, the main signal generator can generate a main power-on reset signal by using a normal signal among a plurality of power-on reset signals.

According to another aspect of a semiconductor integrated circuit of the present invention, the main reset signal generator respectively generates pulses synchronizing with transition edges of the sub power-on reset signal(s) and an external power-on reset signal. The main power-on reset signal can be easily synthesized by using these pulses.

According to one aspect of, a method for initializing a semiconductor integrated circuit of the present invention, a plurality of power-on reset signals can be generated according to sub power-on reset signals whose timings differ from each other. And, internal circuits can be reliably initialized according to one from any of these power-on reset signals.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF TEE PREFERRED EMBODIMENTS

Hereinafter, a description is given of embodiments of the invention with reference to the accompanying drawings.

Figure 1:
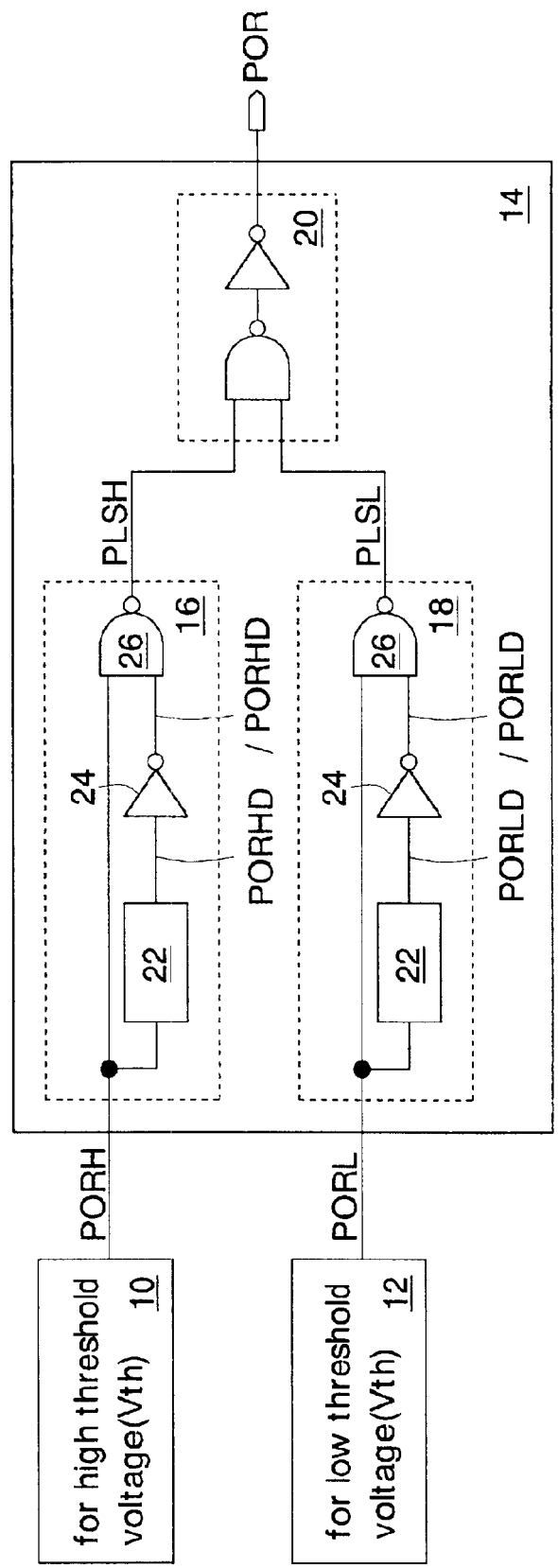
FIG. 1 is a block diagram showing a power-on resetting circuit in a first embodiment of the semiconductor integrated circuit in the present invention.

FIG. 1 shows a power-on resetting circuit according to a first embodiment of a semiconductor integrated circuit of the invention.

The semiconductor integrated circuit is formed as a cell-based IC or a system LSI, which has an SRAM core on a silicon substrate using a CMOS process.

The power-on resetting circuit has sub reset signal generators 10 and 12, and a main reset signal generator 14. The main reset signal generator 14 has pulse generators 16 and 18 respectively corresponding to the sub reset signal generators 10 and 12 and a composite circuit 20 that receives outputs of the pulse generators 16 and 18.

The sub reset signal generators 10 and 12 respectively generate power-on reset signals POREL and PORL. The power-on reset signal PORH is generated at an optimal timing when the threshold voltage of a transistor is high, and the power-on reset signal PORL is generated at an optimal timing when the threshold voltage of the transistor is low.

The pulse generators 16 and 18 are provided with a delay circuit 22 and an inverter 24, which are connected in series, and a NAND gate 26 that receives output of the inverter 24 and input signals (power-on reset signals PORE and PORL). The delay circuit 22 of the pulse generator 16 outputs a delayed power-on reset signal PORHD. The inverter 24 of the pulse generator 16 outputs a delayed power-on reset signal/PORHD which is obtained by inverting the delayed power-on reset signal PORHD, and the delay circuit 22 of the pulse generator 18 outputs a delayed power-on reset signal PORLD. The inverter 24 of the pulse generator 18 outputs a delayed power-on reset signal /PORLD which is obtained by inverting the delayed power-on reset signal PORLD. The pulse generators 16 and 18 generate pulses PLSH and PLSL of low level in synchronization with rising edges of input signals.

The composite circuit 20 is constructed of an OR circuit of negative logic. The composite circuit 20 generates a power-on reset signal POR upon receiving the pulses PLSH and PLSL. The power-on reset signal POR is supplied to a predetermined internal circuit of the semiconductor integrated circuit for initializing the internal circuit. In other words, the internal circuit is initialized by either one of the pulses PLSH or PLSL. Thus, the pulses PLSH and PLSL are served as a pulsated power-on reset signal.

Figure 2:
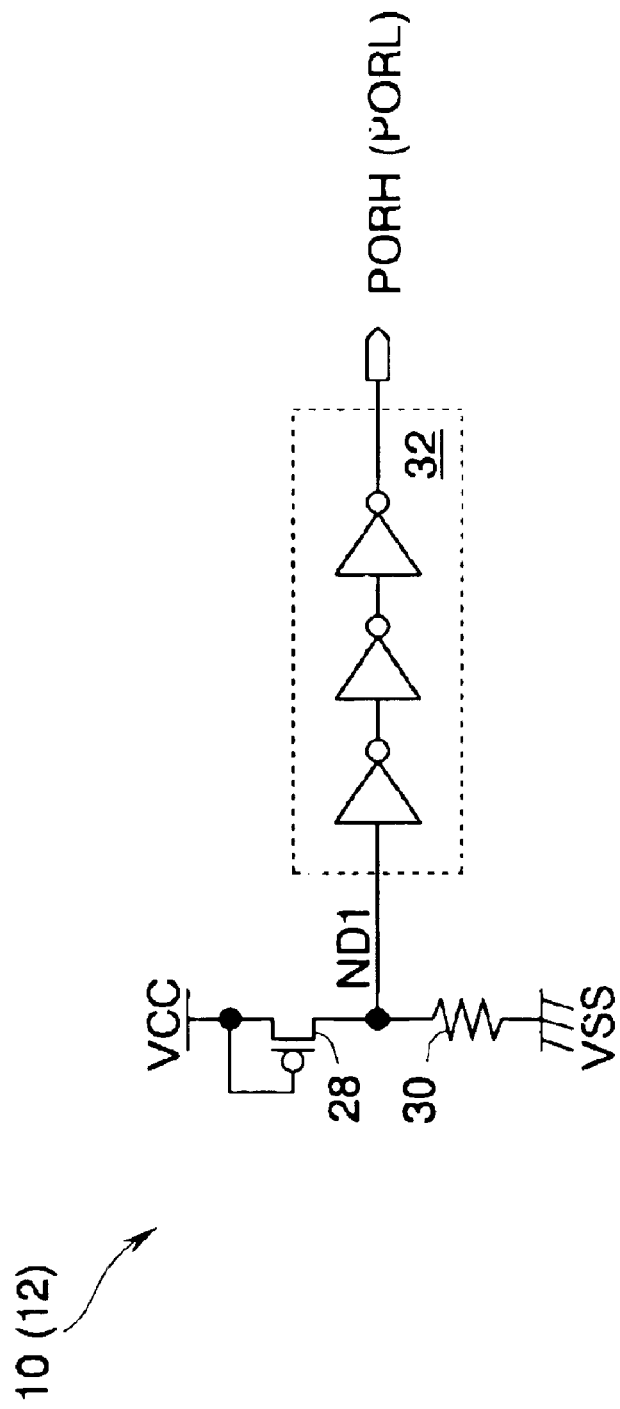
FIG. 2 is a circuit diagram showing the details of sub reset signal generator in FIG. 1.

FIG. 2 shows the detail of the sub reset signal generators 10 and 12.

The sub reset signal generator 10 (or 12) is provided with a PMOS transistor 28 and a resistor 30, which are connected to each other in series via a node ND1 between a power supply line VCC and a ground line VSS, and a inverter row 32 of inverters in which three inverters are connected in series. Input of the inverter row 32 is connected to the node ND1, and the inverter row 32 inverts a logic level of the node ND1 and outputs it as a power-on reset signal PORH (or PORL).

Figure 3:
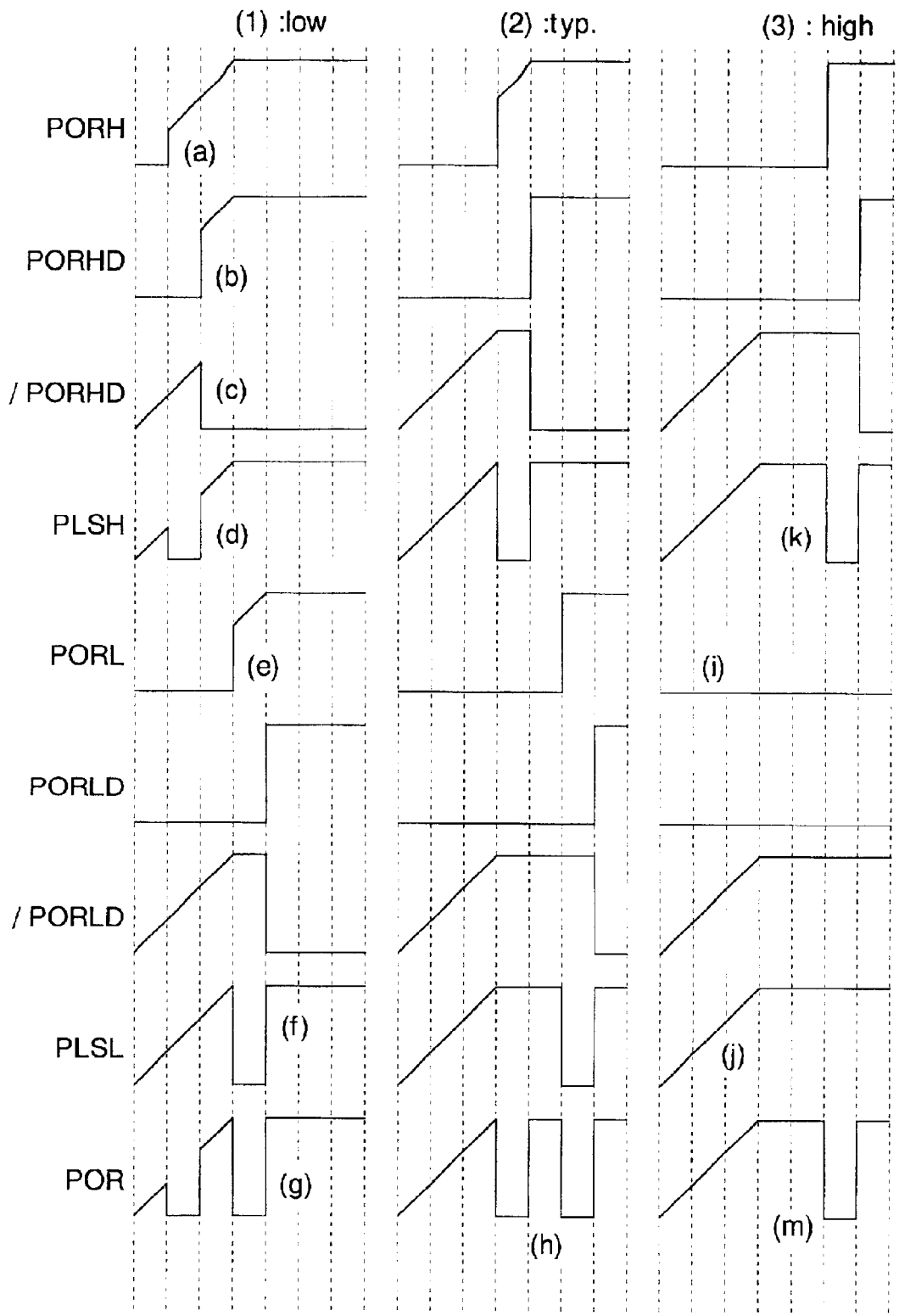
FIG. 3 is a timing chart showing operations of a power-on resetting circuit in FIG. 1.

FIG. 3 shows operations of the above-described power-on resetting circuit when power supply is switched on.

FIGS. 3(1), (2) and (3) respectively show a case where the threshold voltage of the PMOS transistor is low, typical or high.

In FIG. 3(1), since the threshold voltage of the pMOS transistor is lower, the power-on reset signal PORH generated by the sub reset signal generator 10 in FIG. 1 has almost no activating period (low level period) (See (a) in FIG. 3). The delay circuit 22 outputs a delayed signal PORED that is obtained by delaying the power-on reset signal PORH by a predetermined period (See (b) in FIG. 3). The inverter 24 inverts the delayed signal PORHD and outputs an inverted signal /PORRD (See (c) in FIG. 3). The NAND gate 26 generates a pulse PLSE according to the power-on reset signal PORH and inverted signal/PORHD (See (d) in FIG. 3). That is, a pulse PLSH is generated in synchronization with the rising edges of the power-on reset signal PORH.

On the other hand, the sub reset signal generator 12 generates a power-on reset signal PORL at an optimal timing where the threshold voltage of the pMOS transistor is low (see (e) in FIG. 3). After that, the pulse generator 18 generates a delayed signal PORLD, inverted signal/PORLD and pulse signal PLSL as in the above-described pulse generator 16 (See (f) in FIG. 3). The composite circuit 20 generates a power-on reset signal POR having two reset pulses according to pulse signals PLSH and PLSL (See (g) in FIG. 3).

Even if the pulse generator 16 could not generate any pulse PLSH since the threshold voltage of the pMOS transistor is further lower, a power-on reset signal POR having a one reset pulse can be generated from the pulse PLSL generated by the pulse generator 18. Therefore, the internal circuits can be reliably initialized.

In FIG. 3(2), pulses PLSH and PLSL are synthesized as in FIG. 3(1), and a power-on reset signal POR is generated (See (h) in FIG. 3).

In FIG. 3(3), since the threshold voltage of the pMOS transistor is high, the sub reset signal generator 12 cannot inactivate the power-on reset signal PORL (See (i) in FIG. 3). Therefore, the pulse generator 18 cannot generate a reset pulse (See (j) in FIG. 3). The pulse generator 16 generates a pulse PLSH from the power-on reset signal PORH as in FIG. 3(1) (See (k) in FIG. 3). And, a power-on reset signal POR having one reset pulse is generated from the pulse PLSH (See (m) in FIG. 3).

Thus, even if the threshold voltage of the transistor is changed, the power-on reset signal POR can be reliably generated without being influenced, wherein the internal circuits can be initialized. In other words, the generation margin of the power-on resetting circuit can be increased to a large degree in comparison with the prior arts.

As described above, in the semiconductor integrated circuit according to the embodiment, it is possible to generate a power-on reset signal POR without fail, using at least one of the power-on reset signals PORH and PORL, and the internal circuits can be initialized without fail. That is, it is possible to construct a power-on resetting circuit having a wide operation margin, and the internal circuits can be securely initialized.

Pulses PLSH and PLSL are generated in synchronization with the rising edges of the power-on reset signals PORE and PORL, and these pulses PLSE and PLSL are synthesized to generate the power-on reset signal POR. Therefore, it is possible to easily generate a power-on reset signal POR according to power-on reset signals PORH and PORL whose generation timings (inactivating timings) differ from each other.

Further, since pulses PLSH and PLSL that are power-on reset signals are generated according to the power-on reset signals PORH and PORL whose generation timings differ from each other, the internal circuits can be initialized without fail according to one of these pulses PLSH and PLSL.

Figure 4:
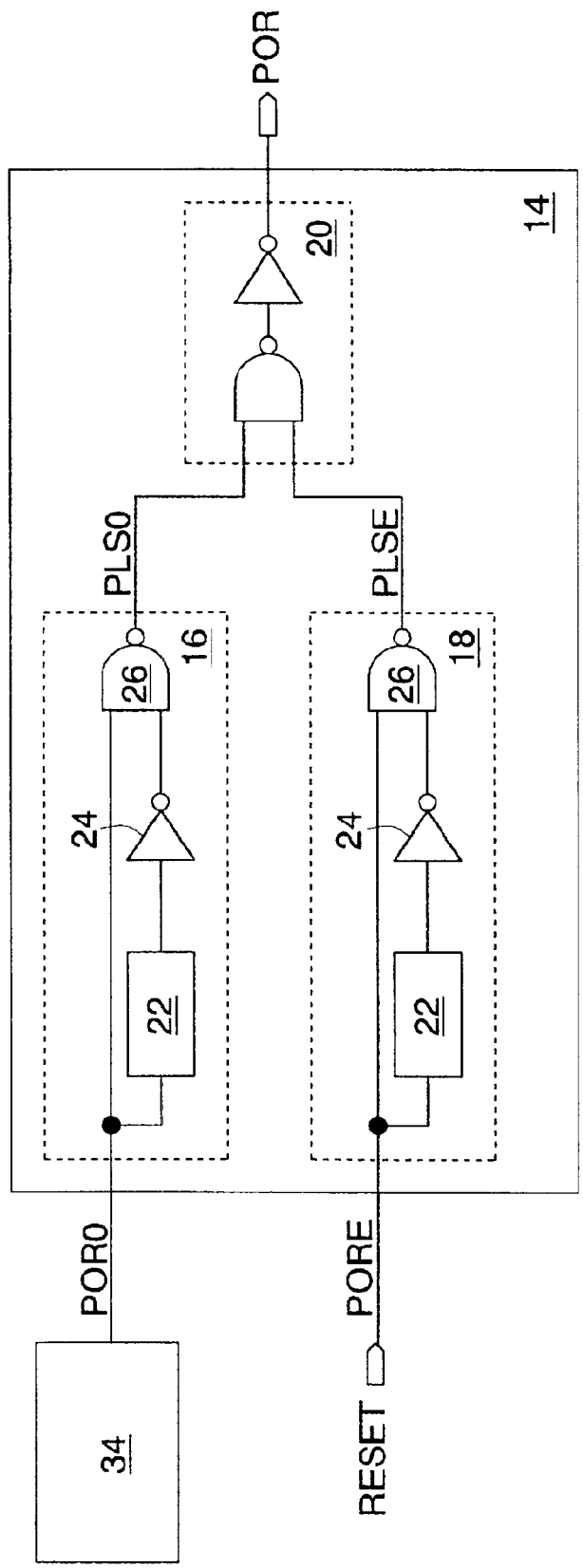
FIG. 4 is a block diagram showing a power-on resetting circuit in a second embodiment of the semiconductor integrated circuit in the present invention.

FIG. 4 shows a second embodiment of a semiconductor integrated circuit according to the invention. Circuits and signals that are identical to those of the first embodiment are given the same reference numbers, and detailed description thereof is omitted.

The function of a power-on resetting circuit according to the second embodiment is included in an SRAM macro. And, where an SRAM is included in a device designed by a user, the SRAM macro is used in a design tool, and the SRAM and power-on resetting circuit are laid out on the semiconductor integrated circuit.

The power-on resetting circuit is provided with one sub reset signal generator 34 and a main reset signal generator 14. The main reset signal generator 14 is the same as that of the first embodiment. The sub reset signal generator 34 generates a power-on reset signal POR0 at an optimal timing where the threshold voltage of the transistor is typical. The pulse generator 16 generates a pulse PLS0 upon receiving the power-on reset signal POR0. The pulse generator 18 generates a pulse PLSE upon receiving a power-on reset signal PORE from the periphery of the power-on resetting circuit via a reset terminal RESET. And the composite circuit 20 synthesizes pulses PLS0 and PLSE to generate a power-on reset signal POR.

In the embodiment, where a power-on reset signal is received from other functional circuits implemented on the semiconductor integrated circuit or a power-on reset signal is received from the exterior of the semiconductor integrated circuit, a power-on reset signal is generated by using power-on reset signals POR0 and PORE. That is, a power-on reset signal which comes from other functional circuits implemented in the semiconductor integrated circuit or from the exterior of the semiconductor integrated circuit is supplied to the main reset signal generator 14 as a power-on reset signal PORE.

Where the power-on reset signal PORE is not received from the exterior of the power-on resetting circuit, the reset terminal RESET is, for example, pulled up. At this time, since the pulse PLSE is always made into a high level, the power-on reset signal POR is generated by using only the power-on reset signal POR0.

In the embodiment, effects that are the same as those of the first embodiment can be brought about. Further, in this embodiment, it is possible to securely generate the power-on reset signal POR by using at least one of the power-on reset signals POR0 and PORE, and the internal circuits can be initialized without fail.

Figure 5:
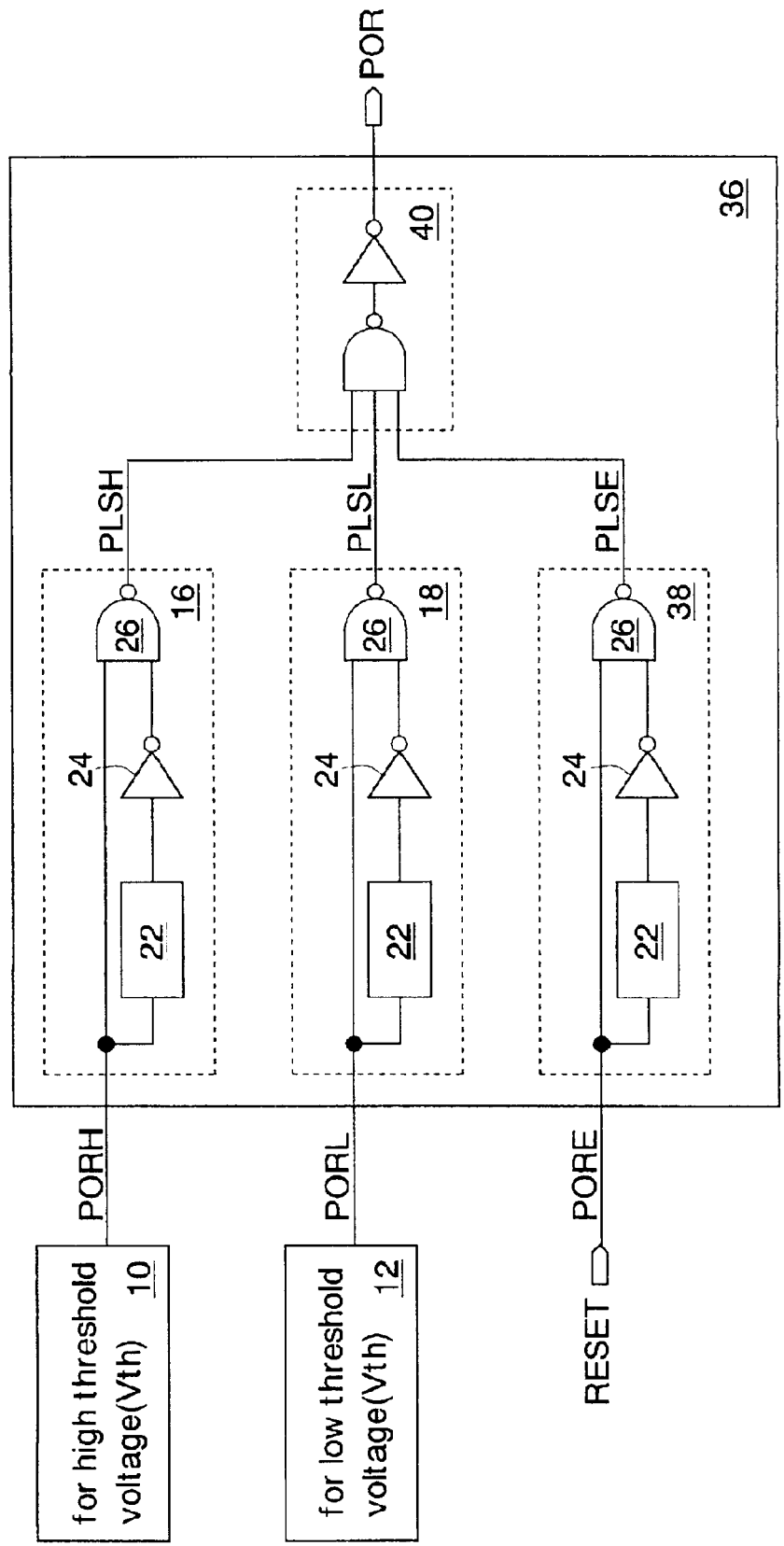
FIG. 5 is a block diagram showing a power-on resetting circuit in a third embodiment of the semiconductor integrated circuit in the present invention.

FIG. 5 shows a third embodiment of the semiconductor integrated circuit according to the invention. Circuits and signals that are identical to those of the first and second embodiments are given the same reference numbers, and detailed description thereof is omitted.

The function of the power-on resetting circuit according to the third embodiment is included in an SRAM macro as in the second embodiment.

The power-on resetting circuit is provided with two sub reset signal generators 10 and 12 and a main reset signal generator 36. The main reset signal generator 36 has pulse generators 16 and 18 respectively corresponding to the sub reset signal generators 10 and 12, a pulse generator 38 that receives a power-on reset signal PORE from the exterior of the power-on resetting circuit, and a composite circuit 40 that receives outputs of the pulse generators 16, 18 and 38.

The sub reset signal generators 10 and 12 and pulse generators 16 and 18 are the same as those of the first embodiment. The pulse generator 38 is the same as the pulse generator 16. The composite circuit 40 is constructed of a negative logic OR circuit. The composite circuit 40 receives pulses PLSH, PLSL and PLSE and generates a power-on reset signal POR.

That is, in the embodiment, as in the second embodiment, a power-on reset signal POR is generated by using at least one from any of the power-on reset signals PORH and PORL generated inside the power-on resetting circuit, and a power-on reset signal PORE supplied from the periphery of the power-on resetting circuit.

Where no power-on reset signal is received from the periphery of the power-on resetting circuit, the reset terminal RESET is, for example, pulled up. At this time, since the pulse PLSE is always made into high level, the power-on reset signal POR is generated by using one of the power-on reset signals PORH and PORL as in the first embodiment.

Also, in this embodiment, effects that are the same as those in the first and second embodiments can be brought about.

In addition, in the first embodiment described above, a description was given of an example in which the present invention is applied to a semiconductor integrated circuit having a SRAM core. However, the present invention is not limited to such an embodiment. But it may be applicable to any semiconductor integrated circuit having internal circuits for which initialization is generally required.

The invention is not limited to the above embodiments and various modifications may be mad without departing from the spirit and the scope of the invention. Any improvements may be in part or all of the components.

What is claimed is:

1. A semiconductor integrated circuit comprising:

a sub reset signal generator for generating a sub power-on reset signal;

a reset terminal for receiving an external power-on reset signal; and a main reset signal generator for generating a pulse signal including at least one rectangular pulse as a main power-on reset signal to initialize an internal circuit, according to at least one of said sub power-on reset signal and said external power-on reset signal, wherein said main reset signal generator comprises a plurality of pulse generators for respectively generating pulses on the basis of a transition edge for a corresponding one of said sub power-on reset signal and said external power-on reset signal, and a composite circuit for synthesizing said pulses to generate said main power-on reset signal.

2. A semiconductor integrated circuit comprising:

a plurality of sub reset signal generators for generating a plurality of sub power-on reset signals at timings different from each other, when detecting that a power supply is switched on;

a reset terminal for receiving an external power-on reset signal; and a main reset signal generator for generating a pulse signal including at least one rectangular pulse as a main power-on reset signal to initialize an internal circuit, according to at least one from any of said sub power-on reset signals and said external power-on reset signal, wherein said main-reset signal generator comprises a plurality of pulse generators for respectively generating pulses on the basis of a transition edge for a corresponding one of said sub power-on reset signals and said external power-on reset signal, and a composite circuit for synthesizing said pulses to generate said main power-on reset signal.

3. A semiconductor integrated circuit comprising:

a plurality of sub reset signal generators for generating a plurality of sub power-on reset signals at timings different from each other, when detecting that a power supply is switched on;

a plurality of pulse generators for generating pulses on the basis of the plurality of sub power-on reset signals, respectively, at least one of said pulses being a rectangular pulse; and a composite circuit for synthesizing the pulses to generate a main power-on reset signal.

4. A method of initializing a semiconductor integrated circuit having a plurality of sub reset signal generators including, transistors having threshold values, the method comprising the steps of:

generating a plurality of sub power-on reset signals, each according to respective threshold values of each of the transistors, when detecting that a power supply is switched on;

respectively generating pulses on the basis of a transition edge for a corresponding one of said sub power-on reset signals, at least one of said pulses including a rectangular pulse; and synthesizing the pulses to generate a main power-on reset signal.

5. A semiconductor integrated circuit comprising:

a sub reset signal generator for generating a sub power-on reset signal;

a reset terminal for receiving an external power-on reset signal supplied from the exterior of the semiconductor integrated circuit; and a main reset signal generator for generating a pulse signal as a main power-on reset signal to initialize an internal circuit, according to at least one of said sub power-on reset signal and said external power-on reset signal, wherein said main reset signal generator comprises a plurality of pulse generators, wherein each pulse generator generates a respective pulse on the basis of a respective transition edge which corresponds to one of said sub power-on reset signal and said external power-on reset signal, and a composite circuit for synthesizing said pulses to generate said main power-on reset signal.

6. A semiconductor integrated circuit comprising:

a plurality of sub reset signal generators for generating a plurality of sub power-on reset signals at timings different from each other, when detecting that a power supply is switched on:

a reset terminal for receiving an external power-on reset signal supplied from the exterior of the semiconductor integrated circuit; and a main reset signal generator for generating a rectangular pulse signal as a main power-on reset signal to initialize an internal circuit, according to at least one from any of said sub power-on reset signals and said external power-on reset signal, wherein said main reset signal generator comprises a plurality of pulse generators, wherein each pulse generator generates a respective pulse on the basis of a respective transition edge which corresponds to one of said sub power-on reset signals and said external power-on reset signal, and a composite circuit for synthesizing said pulses to generate said main power-on reset signal.

7. A semiconductor integrated circuit comprising:

a plurality of sub reset signal generators for generating a plurality of sub power-on reset signals at timings different from each other, when detecting that a power supply is switched on; and a main reset signal generator including a plurality of pulse generators for respectively generating pulses on the basis of a transition edge for a corresponding one of said sub power-on reset signals; and a composite circuit for synthesizing the pulses to generate a main power-on reset signal, wherein said main reset signal generator generates said main power-on reset signal having pulses respectively corresponding to each of said sub power-on reset signals, when threshold values of transistors formed in said semiconductor integrated circuit are typical values.

8. A method of initializing a semiconductor integrated circuit having a plurality of sub reset signal generators including transistors having threshold values, the method comprising the steps of:

generating a plurality of sub power-on reset signals, each according to respective threshold values of each of the transistors, when detecting that a power supply is switched on;

respectively generating pulses on the basis of a transition edge for a corresponding one of said sub power-on reset signals, said pulses not overlapping each other when threshold values of transistors formed in said semiconductor integrated circuit are typical values; and synthesizing the pulses to generate a main power-on reset signal.

* * * * *